United States Patent
Liu et al.

(10) Patent No.: US 11,309,321 B2
(45) Date of Patent: *Apr. 19, 2022

(54) INTEGRATED STRUCTURES CONTAINING VERTICALLY-STACKED MEMORY CELLS

(71) Applicant: Micron Technology, Inc., Boise, ID (US)

(72) Inventors: Haitao Liu, Boise, ID (US); Chandra Mouli, Boise, ID (US); Sergei Koveshnikov, Boise, ID (US); Dimitrios Pavlopoulos, Boise, ID (US); Guangyu Huang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/107,814

(22) Filed: Nov. 30, 2020

(65) Prior Publication Data

US 2021/0082937 A1 Mar. 18, 2021

Related U.S. Application Data

(63) Continuation of application No. 16/421,262, filed on May 23, 2019, now Pat. No. 10,892,268, which is a (Continued)

(51) Int. Cl.
*H01L 27/11556* (2017.01)
*H01L 21/28* (2006.01)
*H01L 27/11582* (2017.01)

(52) U.S. Cl.
CPC .. *H01L 27/11556* (2013.01); *H01L 29/40114* (2019.08); *H01L 27/11582* (2013.01); *H01L 29/40117* (2019.08)

(58) Field of Classification Search
CPC ........... H01L 27/11524; H01L 27/1157; H01L 29/04; H01L 29/66833; H01L 29/7926;
(Continued)

(56) References Cited

U.S. PATENT DOCUMENTS

| 6,727,544 B2 | 4/2004 | Endoh et al. |
| 8,410,538 B2 | 4/2013 | Ishiduki et al. |

(Continued)

FOREIGN PATENT DOCUMENTS

| CN | 102709290 | 10/2012 |
| CN | 103872055 | 6/2014 |

(Continued)

OTHER PUBLICATIONS

CN CN 201680048220.9 Search Rept., dated Oct. 11, 2012, Micron Technology, Inc.
(Continued)

Primary Examiner — Eric A. Ward
(74) Attorney, Agent, or Firm — Wells St. John P.S.

(57) ABSTRACT

Some embodiments include an integrated structure having a stack of alternating dielectric levels and conductive levels, and having vertically-stacked memory cells within the conductive levels. An opening extends through the stack. Channel material is within the opening and along the memory cells. At least some of the channel material contains germanium.

9 Claims, 5 Drawing Sheets

Related U.S. Application Data continuation of application No. 15/677,914, filed on Aug. 15, 2017, now Pat. No. 10,381,365, which is a continuation of application No. 14/827,695, filed on Aug. 17, 2015, now Pat. No. 9,761,599.

(58) Field of Classification Search
CPC ........ H01L 21/02532; H01L 27/11578–11582; H01L 27/11551–11556; H01L 29/40114; H01L 29/40117
See application file for complete search history.

(56) References Cited

U.S. PATENT DOCUMENTS

| | | | |
|---|---|---|---|
| 8,415,242 B2 | 4/2013 | Mizushima | |
| 8,431,961 B2 | 4/2013 | Liu et al. | |
| 8,530,957 B2 | 9/2013 | Mizushima et al. | |
| 8,722,525 B2 | 5/2014 | Sinha | |
| 9,147,691 B2 | 9/2015 | Sinha | |
| 9,368,510 B1 | 6/2016 | Rabkin et al. | |
| 9,761,599 B2 | 9/2017 | Liu et al. | |
| 10,381,365 B2 * | 8/2019 | Liu | H01L 29/40114 |
| 2002/0154556 A1 | 10/2002 | Endoh et al. | |
| 2010/0240205 A1 | 6/2010 | Son et al. | |
| 2011/0227140 A1 | 9/2011 | Ishiduki et al. | |
| 2011/0233646 A1 | 9/2011 | Mizushima et al. | |
| 2011/0272764 A1 | 11/2011 | Kim | |
| 2011/0294290 A1 | 12/2011 | Nakanishi et al. | |
| 2012/0068242 A1 | 3/2012 | Shin et al. | |
| 2012/0115289 A1 | 5/2012 | Scheuerlein | |
| 2012/0199877 A1 | 8/2012 | Liu et al. | |
| 2012/0326221 A1 | 12/2012 | Sinha | |
| 2013/0069118 A1 | 3/2013 | Mori | |
| 2013/0078776 A1 | 3/2013 | Kim et al. | |
| 2013/0092872 A1 | 4/2013 | Hong et al. | |
| 2013/0115761 A1 | 5/2013 | Kim et al. | |
| 2013/0187217 A1 | 7/2013 | Mizushima et al. | |
| 2013/0248977 A1 | 9/2013 | Mori et al. | |
| 2013/0270625 A1 | 10/2013 | Jang et al. | |
| 2013/0270631 A1 | 10/2013 | Kim et al. | |
| 2014/0246716 A1 | 9/2014 | Sinha | |
| 2014/0264524 A1 * | 9/2014 | Lai | H01L 21/764 257/314 |
| 2014/0264525 A1 | 9/2014 | Takahasi et al. | |
| 2014/0273373 A1 | 9/2014 | Makala et al. | |
| 2015/0054058 A1 * | 2/2015 | Seol | H01L 29/42332 257/324 |
| 2015/0171106 A1 | 6/2015 | Suh | |
| 2015/0179661 A1 | 6/2015 | Huo et al. | |
| 2015/0303213 A1 | 10/2015 | Sim et al. | |
| 2015/0333103 A1 | 11/2015 | Toh et al. | |
| 2016/0020218 A1 | 1/2016 | Sinha | |
| 2016/0064406 A1 | 3/2016 | Natori et al. | |
| 2016/0071861 A1 | 3/2016 | Serov et al. | |
| 2016/0099250 A1 * | 4/2016 | Rabkin | H01L 21/02532 257/66 |
| 2016/0148947 A1 * | 5/2016 | Seo | H01L 27/11565 257/324 |
| 2016/0276361 A1 | 9/2016 | Noda | |
| 2016/0351576 A1 | 12/2016 | Yamazaki et al. | |
| 2017/0250193 A1 | 8/2017 | Huo | |

FOREIGN PATENT DOCUMENTS

| | | |
|---|---|---|
| CN | 104659207 | 5/2015 |
| CN | 104716142 | 6/2015 |
| CN | 201680048220.9 | 6/2021 |
| TW | 105120814 | 10/2017 |
| WO | PCT/US2016/038231 | 2/2018 |

OTHER PUBLICATIONS

WO PCT/US2016/038231 Search Rept., dated Sep. 29, 2016, Micron Technology, Inc.
WO PCT/US2016/038231 Writ. Opin., dated Sep. 29, 2016, Micron Technology, Inc.
Wang et al., "Silicon Interlayer Hereojunction Effects in Polycrystalline Si1-xGex Thin Film Transistors", 56th Annual Device Research Conference Digest, Charlottesville, VA, Jun. 22-24, 1998, pp. 106-107.

* cited by examiner

INTEGRATED STRUCTURES CONTAINING VERTICALLY-STACKED MEMORY CELLS

RELATED PATENT DATA

This patent resulted from a continuation of U.S. patent application Ser. No. 16/421,262 filed May 23, 2019, which is a continuation of U.S. patent application Ser. No. 15/677,914 which was filed Aug. 15, 2017, now U.S. Pat. No. 10,381,365, which is a continuation of U.S. patent application Ser. No. 14/827,695 which was filed Aug. 17, 2015, now U.S. Pat. No. 9,761,599, each of which is hereby incorporated herein by reference.

TECHNICAL FIELD

Integrated structures containing vertically-stacked memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory, and may be configured to comprise vertically-stacked memory cells. It is desired to develop improved NAND architecture.

DETAILED DESCRIPTION OF THE ILLUSTRATED EMBODIMENTS

Some embodiments include utilization of germanium or silicon/germanium within the channel material of vertical NAND configurations. Germanium has better mobility than the silicon conventionally utilized for the channel material, which may improve current conduction along a NAND string. Example embodiments are described with reference to FIGS. 1-10.

Figure 1:
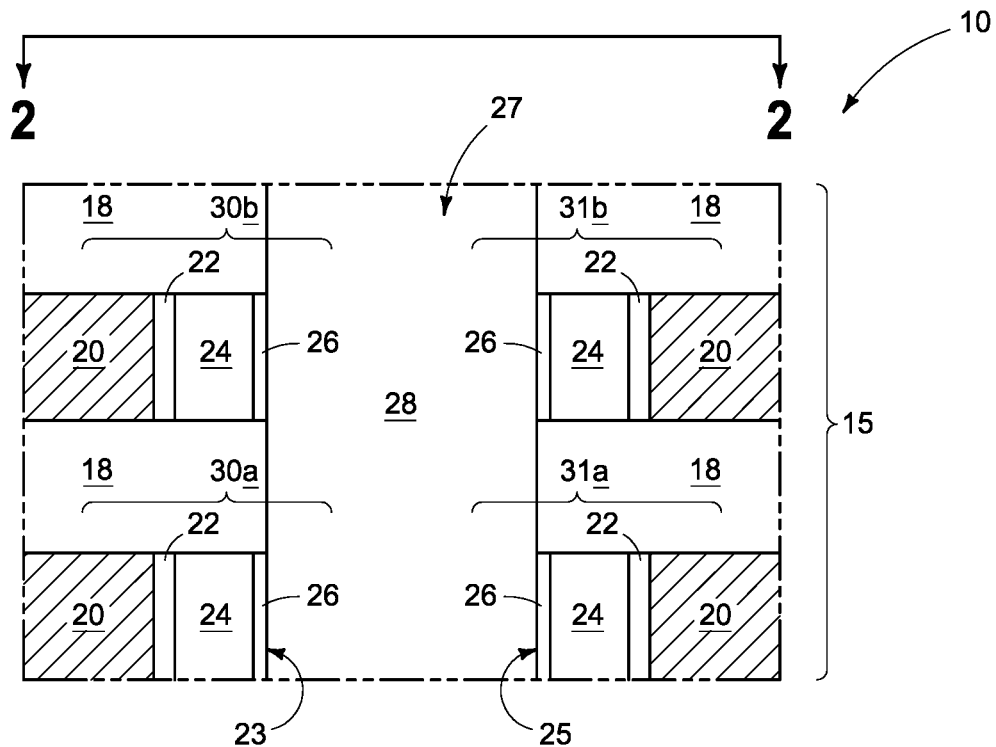
FIG. 1 is a diagrammatic cross-sectional view of an example embodiment integrated structure.

Referring to FIG. 1, a semiconductor construction (i.e., integrated structure) 10 is shown to comprise a stack 15 of alternating first and second levels 18 and 20. The levels 18 may be dielectric, and the levels 20 may be conductive. The conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 20 may comprise n-type doped polycrystalline silicon (i.e., n-type doped polysilicon). The dielectric levels 18 may comprise any suitable composition or combination of compositions; and may, for example, comprise silicon dioxide.

The levels 18 and 20 may be of any suitable thicknesses; and may, for example, have thicknesses within a range of from about 5 nm to about 300 nm. In some applications, the levels 18 may be thinner than the levels 20. For instance, levels 18 may be about 20 nm thick and levels 20 may be about 30 nm thick.

Charge-storage material 24 is adjacent the conductive levels 20, and is spaced from the conductive material of levels 20 by charge-blocking material 22.

The charge-storage material 24 may comprise any suitable composition or combination of compositions; and in some embodiments may comprise floating gate material (for instance, doped or undoped silicon) or charge-trapping material (for instance, silicon nitride, metal dots, etc.).

The charge-blocking material 22 may comprise any suitable composition or combination of compositions; and in some embodiments may comprise one or more of silicon dioxide, hafnium oxide, zirconium oxide, silicon nitride, etc.

Gate dielectric 26 is adjacent charge-storage material 24. The gate dielectric may comprise any suitable composition or combination of compositions; and in some embodiments may comprise, for example, silicon dioxide.

An opening 27 extends through the stack 15, and in the shown embodiment such opening is entirely filled with channel material 28. The channel material comprises germanium. For instance, the channel material may comprise $Si_{(1-x)}Ge_x$; where x is a number greater than zero, and less than or equal to 1. In some embodiments, the channel material may comprise, consist essentially of, or consist of, silicon and germanium. The germanium may be present to, for example, a concentration within a range of from about 5 atomic percent to about 80 atomic percent. As another example, the germanium may be present to a concentration within a range of from about 10 atomic percent to about 30 atomic percent.

In some embodiments, the channel material may comprise one or more dopants. In such embodiments, the dopants may be p-type, n-type and/or i-type.

The various materials 22, 24 and 26, together with regions of conductive levels 20 and channel material 28, form a first series of vertically-stacked memory cells 30a and 30b, and a second series of vertically-stacked memory cells 31a and 31b. The vertically-stacked memory cells 30a and 30b may be considered to form a first NAND string, and the vertically-stacked memory cells 31a and 31b may be considered to form a second NAND string. The memory cells may be considered to be within the conductive levels 20 (i.e., elevationally coextensive with the conductive levels) in the illustrated embodiment.

The number of memory cells in each vertical string is determined by the number of conductive levels 20. The stack may comprise any suitable number of conductive levels. In some embodiments, the stack 15 may comprise 8 conductive levels, 16 conductive levels, 32 conductive levels, 64 conductive levels, 1024 conductive levels, etc.

Figure 2:
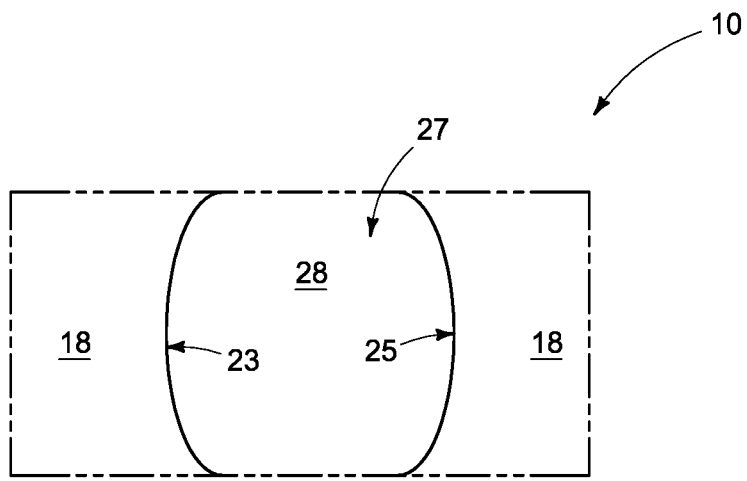
FIG. 2 is a diagrammatic top-down view of the example embodiment integrated structure of FIG. 1, and is a view along the line 2-2 of FIG. 1.

The cross-section section of FIG. 1 shows opening 27 having two opposing sidewalls 23 and 25. However, the opening may have a closed shape when viewed from above so that such sidewalls actually merge into a single continuous sidewall. For instance, the opening may have a circular shape, elliptical shape, polygonal shape, rectangular shape, etc. when viewed from above. FIG. 2 shows an example embodiment of an opening 27 having a closed shape when viewed from above. In the embodiment of FIG. 2, the sidewalls 23 and 25 are part of a single continuous sidewall extending around the closed shape of opening 27.

The channel material 28 of FIG. 1 is shown comprising a homogeneous composition throughout. In other embodiments, the channel material may comprise a gradient of germanium concentration and/or a gradient of dopant concentration. For instance, FIGS. 3 and 4 show constructions 10a and 10b, respectively, comprising horizontally-extending gradients of germanium concentration.

Figure 3:
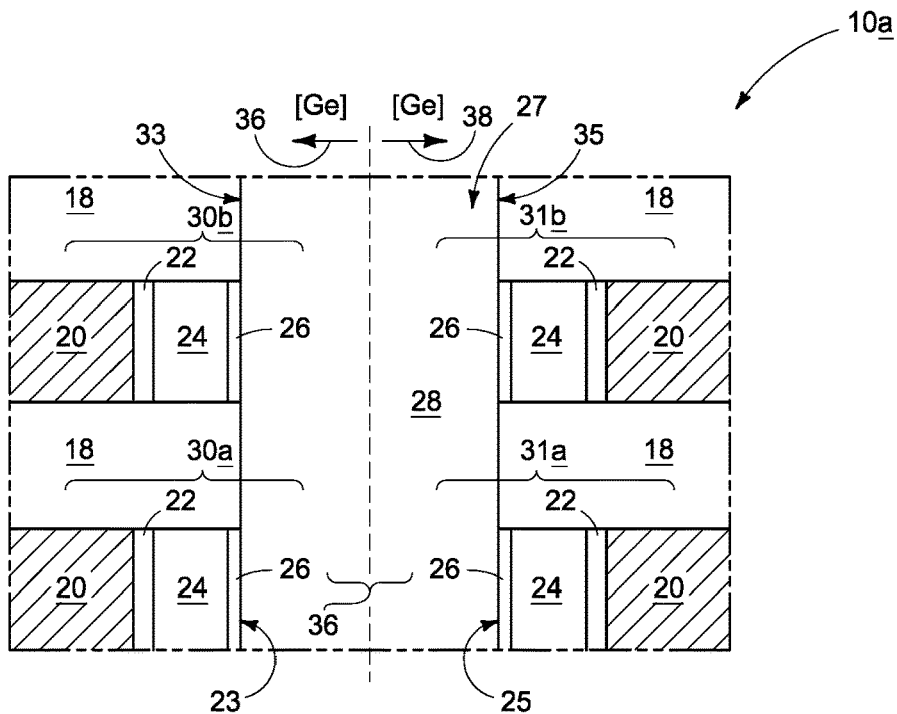
FIGS. 3-10 are diagrammatic cross-sectional views of example embodiment integrated structures.

Referring to FIG. 3, the channel material has exterior surfaces 33 and 35 along the sidewalls 23 and 25, respectively, of the opening 27. The channel material also comprises an interior region 36 between the exterior surfaces, with the interior region being horizontally offset from the exterior surfaces. In the shown embodiment, the germanium concentration [Ge] increases along directions from the interior region to the exterior surfaces as indicated by arrows 36 and 38. Alternatively, the embodiment of FIG. 3 may be considered to illustrate decreasing germanium concentration along directions from the exterior surfaces 33 and 35 toward the interior region 36.

The germanium concentration gradient may increase from any suitable first concentration to any suitable second concentration. For instance, in some embodiments the first concentration may be about 0 atomic percent germanium and the second concentration may be about 100 atomic percent germanium. As another example, the first concentration may be about 0 atomic percent germanium and the second concentration may be about 85 atomic percent germanium. As another example, the first concentration may be about 5 atomic percent germanium and the second concentration may be about 85 atomic percent germanium. As another example, the first concentration may be about zero atomic percent germanium and the second concentration may be about 30 atomic percent germanium. As another example, the first concentration may be about 10 atomic percent germanium and the second concentration may be about 30 atomic percent germanium.

Figure 4:
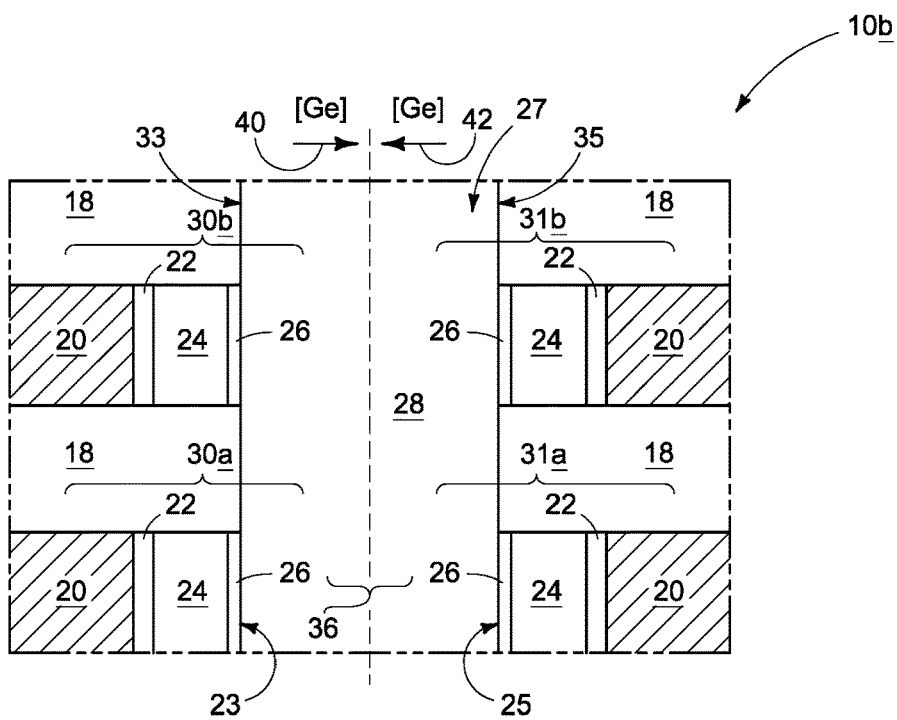

FIG. 4 shows an embodiment similar to that of FIG. 3, but in which the germanium concentration [Ge] increases along directions from the exterior surfaces 33 and 35 toward the interior region 36 of the channel material 28, as indicated by arrows 40 and 42. The germanium concentration gradient may increase from any suitable first concentration to any suitable second concentration. For instance, in some embodiments the first concentration may be about 0 atomic percent germanium and the second concentration may be about 100 atomic percent germanium. As another example, the first concentration may be about 0 atomic percent germanium and the second concentration may be about 85 atomic percent germanium. As another example, the first concentration may be about 5 atomic percent germanium and the second concentration may be about 85 atomic percent germanium. As another example, the first concentration may be about zero atomic percent germanium and the second concentration may be about 30 atomic percent germanium. As another example, the first concentration may be about 10 atomic percent germanium and the second concentration may be about 30 atomic percent germanium.

The embodiments of FIGS. 3 and 4 may advantageously enable channel material properties to be tailored for specific applications in order to have desired electrical, physical and/or chemical properties along the memory cells 30a, 30b, 31a and 31b. For instance, it may be desired to have an appropriate balance between germanium concentration and silicon concentration within the channel material along the memory cells in order to achieve desired electrical mobility and semiconductor properties.

Although the embodiments of FIGS. 3 and 4 specifically illustrate horizontal gradients of germanium concentration, in other embodiments there may also be horizontal gradients of dopant concentration (for instance, horizontal gradients of p-type dopant, n-type dopant and/or i-type dopant). The dopant gradients may extend along the same directions as the germanium gradients, or may be oppositely oriented relative to the germanium gradients.

Figure 5:
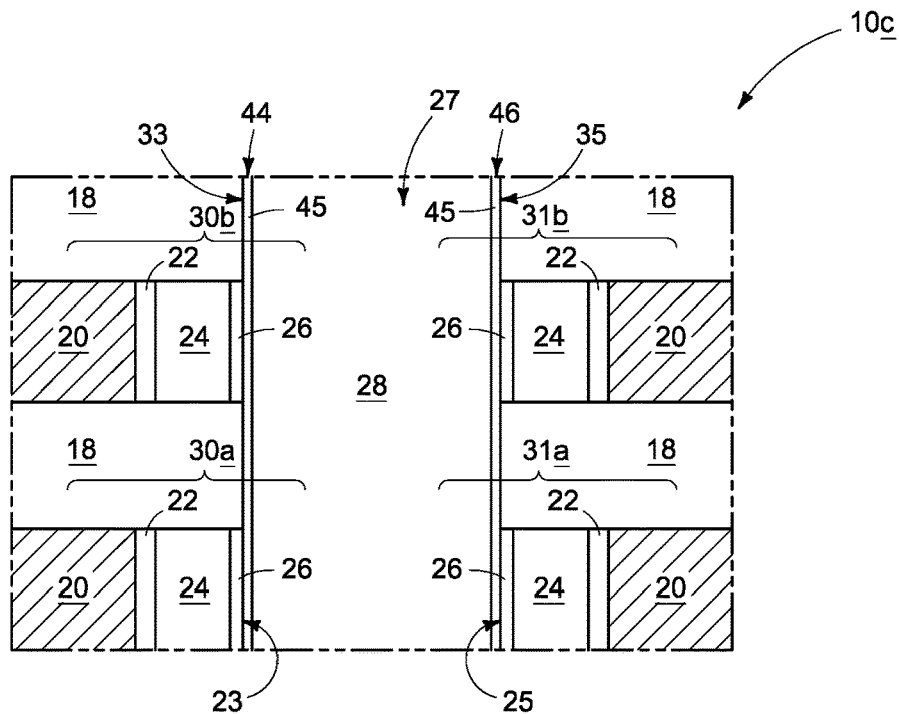

The embodiments of FIGS. 1-4 show germanium-containing material 28 entirely filling opening 27. In other embodiments, liners may be provided along sidewalls of the opening prior to filling the opening with channel material 28. For instance, FIG. 5 shows a construction 10c having liners 44 and 46 along the sidewalls of opening 28. Although two liners are illustrated in the cross-section section of FIG. 5, it is to be understood that the opening may have a closed shape (as described with reference to FIG. 2), and accordingly the illustrated liners may be part of a single liner which extends entirely around the closed shape of the opening.

The liners 44 and 46 comprise liner material 45. Such liner material may be a non-germanium-containing material. In some embodiments, the liner material may be non-germanium-containing semiconductor material (and in particular embodiments may be a wide band-gap containing semiconductor material). For example, the liner material may comprise silicon (which may be monocrystalline, polycrystalline, amorphous, etc.), III/V semiconductor material, II/VI semiconductor material, etc. For instance, the liners may comprise silicon carbide, gallium arsenide, zinc oxide, indium oxide, tin oxide, etc. The liners may be doped in some embodiments, and in other embodiments may be undoped.

In the embodiment of FIG. 5, the material 28 may be considered a germanium-containing material which is spaced from sidewalls 23 and 25 of opening 27 by the non-germanium-containing material 45 of liners 44 and 46. The germanium-containing material 28 may be homogeneous, or may comprise horizontally-extending germanium gradients of the types described above with reference to FIGS. 3 and 4.

The liners 44 and 46 may have any suitable thicknesses, and in some embodiments may have thicknesses within a range of from about one monolayer to about 60 Å, thicknesses within a range of from about 20 Å to about 50 Å, etc.

The liners may advantageously enable channel material properties to be tailored for specific applications. For instance, in some embodiments the liners may be kept thin enough so that channel conduction of vertically-stacked memory cells (e.g., memory cells 30a, 30b, 31a and 31b) extends through the semiconductor material of the liners, and also through a region of the germanium-containing material 28 adjacent the liners (as shown). Accordingly, the compositions of the liners and the germanium-containing material 28 may be independently adjusted to tailor electrical, physical and/or chemical properties for specific applications. In some embodiments, the liners may increase a distance from tunnel dielectric 26 of the memory cells (e.g., 30a, 30b, 31a and 31b) to channel material 28, which may reduce coulombic scattering.

The embodiments of FIGS. 1-5 show a central region of opening 27 entirely filled with channel material. In other embodiments, the central region of the opening may comprise insulator (which may be, for example, air, silicon dioxide, etc.), as described below with reference to FIGS. 6-10.

Figure 6:
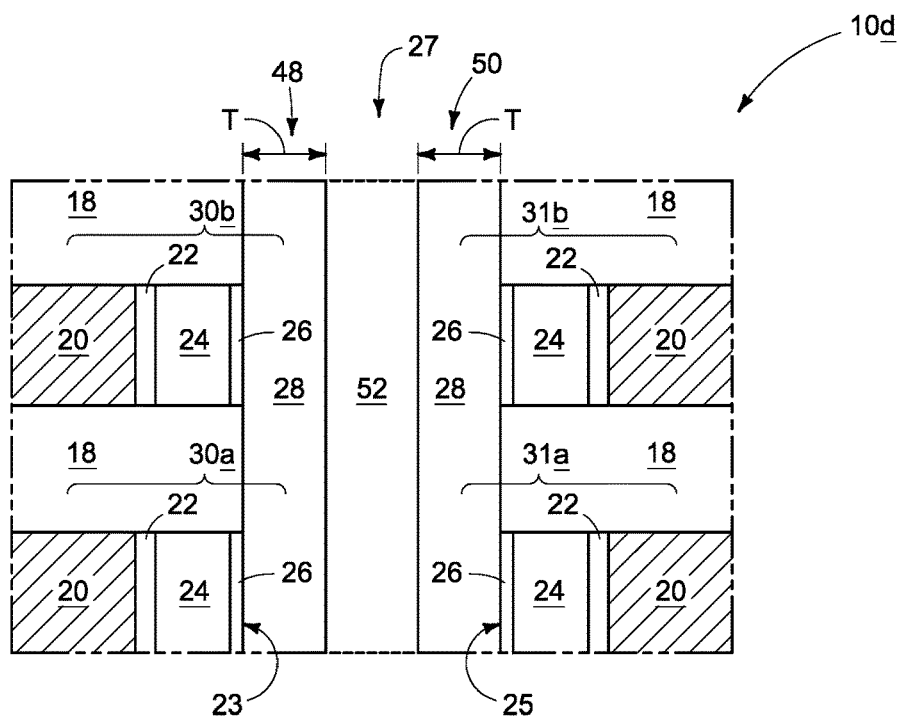

Referring to FIG. 6, a construction 10d is shown to comprise germanium-containing liners 48 and 50 along the sidewalls 23 and 25 of opening 27, with such liners only partially filling the opening to leave a hollow. The construction further comprises insulator 52 between the liners 48 and 50 and within the hollow. The insulator 52 may include gas (for instance, air). Additionally, or alternatively, the insulator may include semisolid or solid material (for instance, silicon dioxide, silicon nitride, etc.).

The liners 48 and 50 may have any suitable thicknesses T; and in some embodiments may have thicknesses within a range of from about 2 nanometers (nm) to about 50 nm.

The germanium-containing material 28 of liners 48 and 50 may comprise any of the compositions described above with reference to the germanium-containing material 28 of FIG. 1. The germanium-containing material 28 of the liners 48 and 50 may be homogeneous (as shown in FIG. 6), or may comprise horizontally-extending gradients of germanium concentration. For instance, FIGS. 7-9 show constructions 10e, 10f and 10g, respectively, comprising horizontally-extending gradients of germanium concentration.

Figure 7:
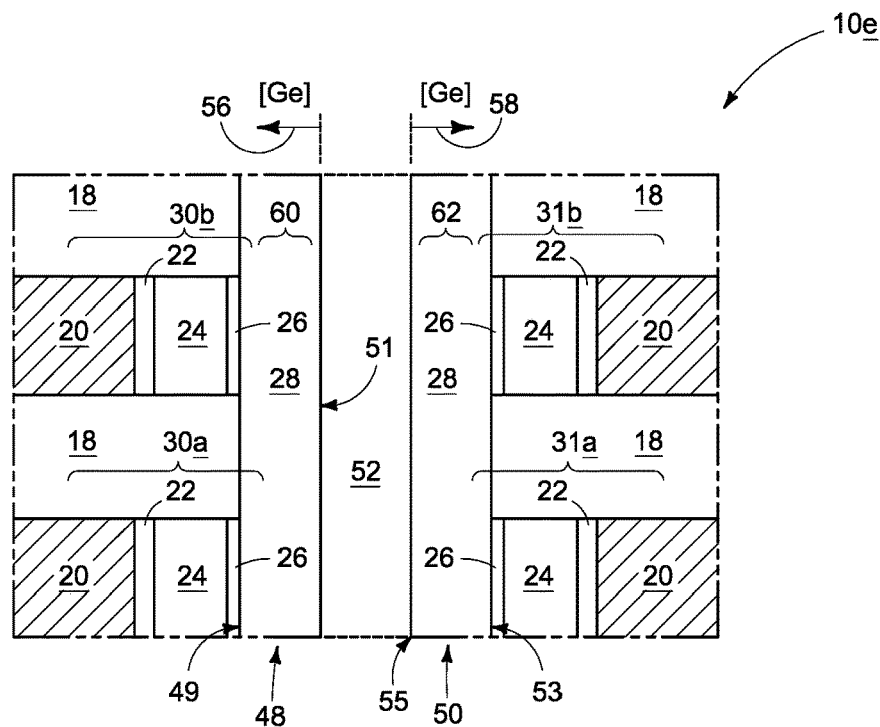

Referring to FIG. 7, the germanium-containing liner 48 has exterior surfaces 49 and 51, and similarly the germanium-containing liner 50 has exterior surfaces 53 and 55; with the surfaces 51 and 55 being adjacent insulator 52, and the surfaces 49 and 53 being along sidewalls of opening 27. In the shown embodiment, the germanium concentration [Ge] increases along directions from the insulator to the sidewalls of opening 27 as indicated by arrows 56 and 58. The germanium concentration gradient may increase from any suitable first concentration to any suitable second concentration, and may, for example, comprise any of the concentration gradients described above with reference to FIGS. 3 and 4.

The liners 48 and 50 may be considered to comprise interior regions 60 and 62 respectively (with such interior regions being inward of the exterior surfaces, and thus being horizontally-offset relative to the exterior surfaces), and the embodiment of FIG. 7 may be considered to illustrate decreasing germanium concentration along directions from the exterior surfaces 49 and 53 toward the interior regions 60 and 62.

Figure 8:
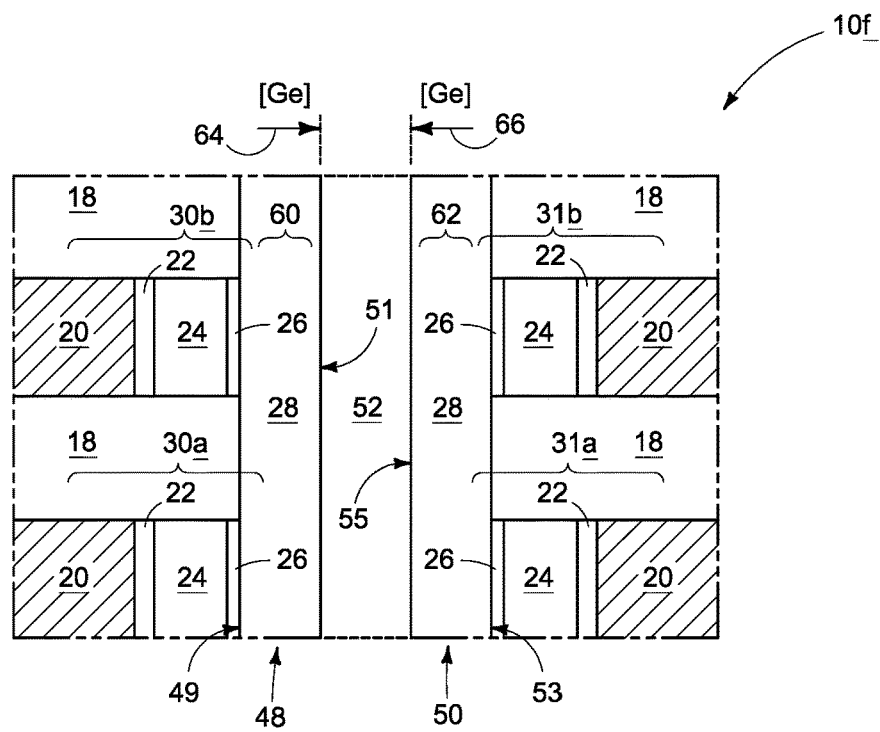
Figure 9:
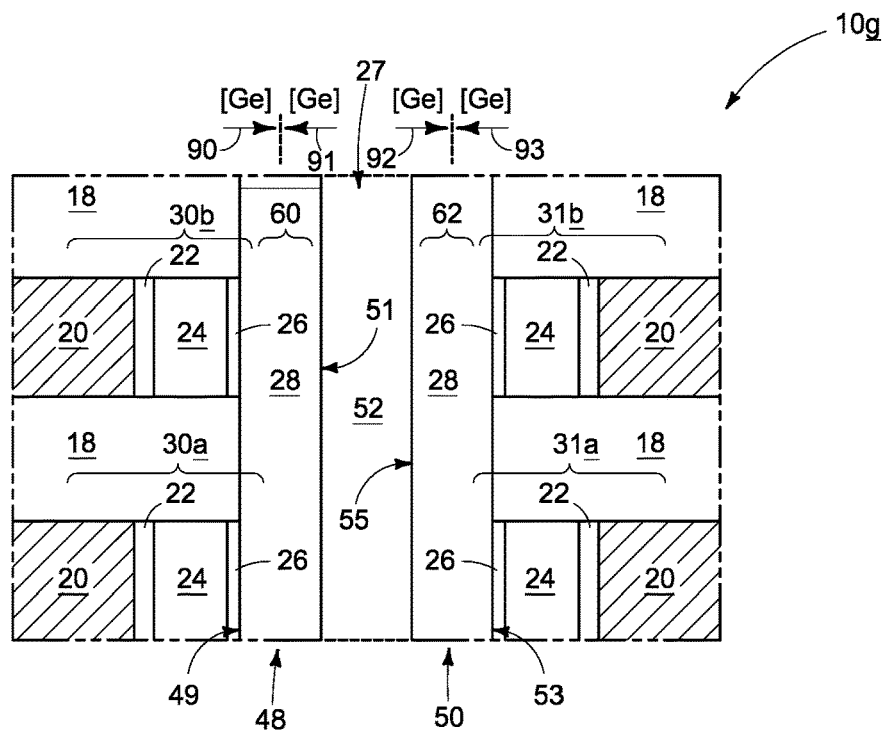

FIG. 8 shows an embodiment similar to that of FIG. 7, but in which the germanium concentration [Ge] increases along directions from the exterior surfaces 49 and 53 toward the interior regions 60 and 62 of the germanium-containing liners, as indicated by arrows 64 and 66. The germanium concentration gradient may increase from any suitable first concentration to any suitable second concentration, and may, for example, comprise any of the concentration gradients described above with reference to FIGS. 3 and 4.

FIG. 9 shows an embodiment in which the germanium concentration [Ge] within each of the germanium-containing liners increases along directions from exterior surfaces toward interior regions as indicated by arrows 90-93. The germanium-containing liner 48 may be considered to comprise a first exterior surface 49 along the sidewall of opening 27, a second exterior surface 51 along the insulator-filled hollow, and an interior region 60 between the first and second exterior surfaces. The germanium concentration within liner 48 may be considered to increase along a first direction from the first exterior surface 49 to the interior region 60, as indicated by the arrow 90; and also to increase along a second direction from the second exterior surface 51 to the interior region 60 as indicated by the arrow 91. The germanium-containing liner 50 may be similarly considered to comprise a first exterior surface 53, a second exterior surface 55, and an interior region 62 between the first and second exterior surfaces. The germanium concentration within liner 50 may be considered to increase along a first direction from the first exterior surface 53 to the interior region as indicated by the arrow 93, and to increase along a second direction from the second exterior surface 55 to the interior region 62 as indicated by the arrow 92.

An advantage of the configuration of FIG. 9 may be that such enables charge to be carried along quantum wells within liners 48 and 50 during utilization of NAND strings.

The embodiments of FIGS. 7-9 may advantageously enable channel material properties to be tailored for specific applications in order to have desired electrical, physical and/or chemical properties along the memory cells 30a, 30b, 31a and 31b. For instance, it may be desired to have an appropriate balance between germanium concentration and silicon concentration within the channel material along the memory cells in order to achieve desired electrical mobility and semiconductor properties.

Although the embodiments of FIGS. 7-9 specifically illustrate horizontal gradients of germanium concentration, in other embodiments there may also be horizontal gradients of dopant concentration (for instance, horizontal gradients of p-type dopant, n-type dopant and/or i-type dopant). The dopant gradients may extend along the same directions as the germanium gradients, or may be oppositely oriented relative to the germanium gradients.

Figure 10:
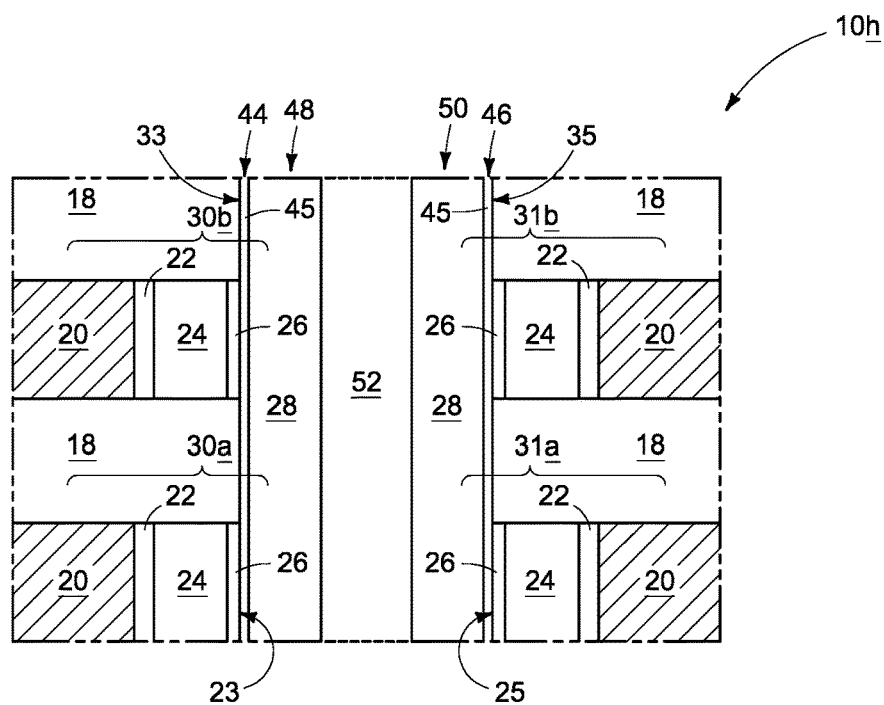

In some embodiments, the germanium-containing liners of FIGS. 6-9 may be utilized in combination with the non-germanium-containing liners of FIG. 5. For instance, FIG. 10 shows a construction 10h which comprises non-germanium-containing liners 44 and 46 utilized together with germanium-containing liners 48 and 50. The liners 44 and 46 comprise the liner material 45 described above with reference to FIG. 5.

In the embodiment of FIG. 10, the materials 28 and 45 may be both utilized as channel material of the memory cells (e.g., memory cells 30a, 30b, 31a and 31b), and accordingly the liners 44, 46, 48 and 50 may be all referred to as channel material liners; with liners 44 and 46 being non-germanium-containing channel material liners, and with liners 48 and 50 being germanium-containing channel material liners. The germanium-containing channel material liners are spaced from sidewalls 23 and 25 of opening 27 by the non-germanium-containing channel material liners 44 and 46 in the embodiment of FIG. 10.

The germanium-containing material 28 of liners 48 and 50 may be homogeneous, or may comprise horizontally-extending germanium gradients of the types described above with reference to FIGS. 7-9

The structures described above may be supported by an underlying substrate (not shown). The substrate may comprise semiconductor material (for example, may comprise, consist essentially of, or consist of monocrystalline silicon), and may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The integrated structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure having a stack of alternating dielectric levels and conductive levels, and having vertically-stacked memory cells within the conductive levels. An opening extends through the stack. Channel material is within the opening and along the memory cells. At least some of the channel material contains germanium.

Some embodiments include an integrated structure comprising, along a cross-section, a stack of alternating dielectric levels and conductive levels, vertically-stacked memory cells within the conductive levels, an opening extending through the stack, germanium-containing channel material liners within the opening and along the memory cells, and an insulator-filled hollow within the opening and between the germanium-containing liners.

Some embodiments include an integrated structure comprising, along a cross-section, a stack of alternating dielectric levels and conductive levels, vertically-stacked memory cells within the conductive levels, an opening extending through the stack, non-germanium-containing channel material liners along sidewalls of the opening and along the memory cells, germanium-containing channel material liners within the opening and along the non-germanium-containing material liners, and an insulator-filled hollow within the opening and between the germanium-containing liners.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure comprising:
   a stack of alternating dielectric levels comprising a dielectric material and conductive levels that comprise a conductive material that physically contacts the dielectric material;
   vertically-stacked memory cells within the conductive levels, each of the vertically stacked memory cells comprising a charge trapping region, the dielectric material of the dielectric levels extending over and beneath the charge trapping region across an entirety of a width of the charge trapping region;
   an opening extending through the stack, the opening having a sidewall extending vertically continuously from top to bottom of the opening; and
   a first channel material liner within the opening and along the memory cells and directly against the dielectric material of the dielectric levels, the first channel material liner comprising tin oxide having a thickness of from one monolayer to 60 Angstroms; and
   a second channel material comprising germanium within the opening and spaced from the sidewall by the first channel material.

2. The integrated structure of claim 1 wherein an entirety of the second channel material comprises $Si_{(1-x)}Ge_x$; where x is a number greater than zero, and less than or equal to 1.

3. The integrated structure of claim 1 wherein the second channel material comprises a concentration of germanium within a range of from about 10 atomic percent to about 30 atomic percent.

4. The integrated structure of claim 1 wherein the second channel material comprises a horizontally-extending gradient of germanium concentration.

5. The integrated structure of claim 4 wherein the second channel material has an exterior surface along the first channel material and an interior region horizontally offset from the exterior surface, and wherein the germanium concentration increases along a direction from the exterior surface toward the interior region.

6. The integrated structure of claim 4 wherein the second channel material has an exterior surface along the first channel material and an interior region horizontally offset from the exterior surface, and wherein the germanium concentration decreases along a direction from the exterior surface toward the interior region.

7. The integrated structure of claim 1 wherein the first and second channel materials completely fill the opening.

8. The integrated structure of claim 1 wherein the first and second channel materials line the sidewalls of the opening to leave a hollow within the opening.

9. The integrated structure of claim 1 further comprising gate oxide disposed entirely within the conductive levels.

* * * * *